US008229382B2

(12) United States Patent
Mak et al.

(10) Patent No.: US 8,229,382 B2
(45) Date of Patent: Jul. 24, 2012

(54) SWITCHED CURRENT RESISTOR PROGRAMMABLE GAIN ARRAY FOR LOW-VOLTAGE WIRELESS LAN AND METHOD USING THE SAME

(75) Inventors: Pui-In Mak, Macau (CN); Seng-Pan U, Macau (CN); Rui P. Martins, Macau (CN)

(73) Assignee: University of Macau, Macau (CN)

( * ) Notice: Subject to any disclaimer, the term of this patent is extended or adjusted under 35 U.S.C. 154(b) by 861 days.

(21) Appl. No.: 12/355,649

(22) Filed: Jan. 16, 2009

(65) Prior Publication Data
US 2010/0184399 A1 Jul. 22, 2010

(51) Int. Cl.
*H04B 1/06* (2006.01)
(52) U.S. Cl. ............... 455/234.1; 455/232.1; 455/234.2; 455/136; 455/138; 455/127.2; 455/127.3; 330/129; 330/131; 330/136; 330/254; 330/278; 330/282; 708/8
(58) Field of Classification Search .................. 455/232, 455/1, 234.1, 234.2, 136, 138, 127.2, 127.3; 330/129, 131, 136, 254, 278, 282; 708/8
See application file for complete search history.

(56) References Cited

U.S. PATENT DOCUMENTS

| | | | | | |
|---|---|---|---|---|---|
| 3,986,049 | A | * | 10/1976 | Campbell et al. | 333/14 |
| 4,484,295 | A | * | 11/1984 | Bedard et al. | 708/8 |
| 5,138,280 | A | * | 8/1992 | Gingrich et al. | 330/295 |

* cited by examiner

*Primary Examiner* — Junpeng Chen
(74) *Attorney, Agent, or Firm* — Osha Liang LLP

(57) ABSTRACT

A switched current resistor (SCR) PGA for constant-bandwidth gain control includes an inverting amplifier, a feedback resistor forming a feedback loop between an output side and an input side of the inverting amplifier, and a switched current resistor (SCR) array connected in parallel to the feedback resistor, and configured to tune a gain range between a maximum and a minimum. The SCR array includes a plurality of switched resistors, each comprising a switch in series with a resistor. When the plurality of switched resistors are switched by a gain-control logic, a plurality of switched current sources and a plurality of grounded resistors are switched correspondingly to deliver a transient current, an equivalent of which flows through the plurality of grounded resistors out from the input side of the inverting amplifier, leading to a feedback factor of the PGA being constant.

16 Claims, 5 Drawing Sheets

SWITCHED CURRENT RESISTOR PROGRAMMABLE GAIN ARRAY FOR LOW-VOLTAGE WIRELESS LAN AND METHOD USING THE SAME

BACKGROUND OF INVENTION

1. Field of the Invention

The present invention relates generally to a switched-current resistor (SCR) programmable gain array (PGA) targeted for wireless local area network (WLAN) applications. More specifically, embodiments of the present invention relate to an SCR PGA, where an SCR array may be employed in parallel with a feedback resistor to achieve constant bandwidth transient-free gain control.

2. Background Art

The rapid evolution of CMOS technology has accelerated the integration of mixed-signal systems, such as the wireless transceiver on a single chip. In the case of a zero intermediate-frequency (IF) or low IF receiver architecture targeted toward IEEE 802.11 a/b/g WLAN applications, signal levels arriving at the baseband are scaled to around a 0 dBm range for analog-to-digital conversion. With technology scaling, capacitive coupling in a zero IF receiver would increase enough to contribute to the de-offset problem. The dc-offset problem may be mitigated through the employment of a low-IF receiver, which also allows for increased integration. However, appropriate design of constituent circuits is vital under low voltage (LV) constraints.

FIG. 1 shows the block diagram of a low-IF receiver 100 in a dual-receive conversion configuration. The receiver 100 may include a Radio Frequency (RF) input 105, a Low Noise Amplifier (LNA) 110 followed by a mixer 115 with a Local Oscillator Reference Frequency ($LO_{RF}$) in the RF range. Due to the difference in the "in-phase" I and the "quadrature" Q signal, mixers 120 and 125 may have different IF reference frequencies ($LO_{IF}$(I) and $LO_{IF}$(Q)). Baseband channel selection filters 130 and 135, and the PGAs 140 and 145, complete the typical low IF receiver block diagram. PGAs are usually standard inverting amplifiers employing a switched-resistor bank for gain control. Terminals 150 and 155 constitute the output. A single synthesizer may synthesize both the IF and RF Local Oscillator (LO) frequencies.

The dynamic-range requirement from the antenna (input terminal 105) to the baseband may approximately equal 0 to 80 dB, with the majority of the gain achieved in the baseband. If the radio front-end offers a 0 to 30 dB range, the baseband channel selection filters 130 and 135, along with the PGAs 140 and 145 have to offer another 0 to 50 dB of controllable gain. Although cascading multiple PGAs may lead to such high gain ranges, excess bandwidths are required of the PGAs, sometimes equal to ten times the bandwidth of the channel-selection filters, to ensure stable selectivity against gain.

Technology scaling within submicron scales, when accompanied with a standard power supply, may not necessitate a significant change in the design of analog blocks. FIG. 2(a) shows a standard inverting amplifier 250 employing a switched-resistor bank $R_{fb}$ 220 for gain control, which serves as a PGA 200. However, in tune with the burgeoning sub-volt nanoscale processes, the classic switched-resistor PGA 200 shown in FIG. 2(a) may be rendered ineffectual because of insufficient LV headroom.

One way to render an inverting amplifier 250 suitable for a minimum drain supply voltage ($V_{DD}$) is to use a level shifter. As shown in FIG. 2(a), an extra input common-mode feedback (I-CMFB) 270 may explicitly bias the virtual ground $V_{vg+}$ and $V_{vg-}$ to a common-mode voltage $V_{cm,in}$, which is the minimum saturation voltage $V_{DSsat}$ (typically 0.1 V) necessary for the transistor to act as a current sink $I_b$ 260. The lowest possible $V_{DD}$ may be estimated by taking into account the voltage requirement into the input stage 252 (see the p-MOS differential pair 252 in FIG. 2(b)), and may be expressed as:

$$V_{DD} > |V_{T,p}| + 2V_{SDsat} + 2V_{DSsat},  \quad (1)$$

where $V_{T,p}$ is the p-channel transistor threshold voltage, and $V_{SDsat}$ is the source-drain saturation voltage. FIG. 2(b) shows the input 252 and output 254 stages of the inverting amplifier 250 of the PGA 200.

For a $V_{T,p}$ of −0.65 V, the lowest possible $V_{DD}$ is approximately 1V. The output 254 stage of the inverting amplifier 250 may be a typical class-A amplifier 254 (see FIG. 2(b)), which delivers a high swing output by locking the output-common mode voltage ($V_{cm,out}$) to $V_{DD}/2$. SS in FIG. 2(b) refers to signal swing. However, a large output swing may require an output common-mode feedback (O-CMFB) 290. For example, a resistive detector may be required to extract $V_{cm,out}$ for conversion into a current signal for the back-end current amplifier. Gain tuning may be accomplished by varying either the feed-forward resistor $R_{ff}$ 215 or the feedback resistor $R_{fb}$ 220 via a switched-resistor bank comprising n-MOS transistor switches and associated resistors. Resistor 215 may also be included in the non-inverting terminal and resistor 220 in the feedback loop thereof. Therefore, the resistors in the non-inverting terminal and the feedback loop thereof are intentionally left unlabeled. The switches may be placed at $V_{vg+}$ and $V_{vg-}$ to gain enough overdrive voltage ($V_{OD}$) of roughly 0.3V. $V_{OD}$ may be expressed as:

$$V_{OD} = V_{DD} - V_{T,n} - V_{DS,sat}, \quad (2)$$

where $V_{T,n}$ is the n-channel transistor threshold voltage.

Additionally, two distinct reference voltages, $V_{ref,in}$ 272 of 0.1 V and $V_{ref,out}$ 285 of 0.5 V may be required (see FIG. 2(a)). Resistors 255 and 275 refer to $R_{cm,in}$ and $R_{cm,out}$ respectively, and resistors 265 and 280 appropriately refer to $R_{cm,in}/2$ and $R_{cm,out}/2$ respectively. Terminals 205 and 210 constitute the input ($V_{in+}$ and $V_{in-}$) of the PGA 200, and terminals 292 and 294 constitute the output ($V_{out+}$ and $V_{out-}$). Amplifiers 267 and 268 are constituent elements of I-CMFB 270 and O-CMFB 290 respectively. $V_{ref,out}$ 285 should be buffered in order to be able to drive the O-CMFB 290 that drains static current.

SUMMARY OF INVENTION

According to one aspect of one or more embodiments of the present invention, an SCR PGA for constant bandwidth gain control includes an inverting amplifier, a feedback resistor forming a feedback loop between an output side and an input side of the inverting amplifier, and an SCR array connected in parallel to the feedback resistor, and configured to tune a gain range between a maximum and a minimum. The SCR array includes a plurality of switched resistors, each comprising a switch in series with a resistor. A constituent switched resistor of the plurality of switched resistors is connected to another switched resistor in parallel. When the plurality of switched resistors are switched by a gain-control logic, a plurality of switched current sources and a plurality of grounded resistors are switched correspondingly such that the plurality of switched current sources deliver a transient current, an equivalent of which flows through the plurality of grounded resistors out from the input side of the inverting amplifier, leading to a feedback factor of the PGA being constant.

According to one aspect of one or more embodiments of the present invention, a receiver for use in wireless local area networks includes a low noise amplifier, a first mixer with a first local oscillator reference frequency in an RF range, a second mixer with a second local oscillator reference frequency in an IF range, a channel selection filter, and an SCR PGA. The SCR PGA includes an inverting amplifier, a feedback resistor forming a feedback loop between an output side and an input side of the inverting amplifier, and an SCR array connected in parallel to the feedback resistor and configured to tune a gain range between a maximum and a minimum. The SCR array includes a plurality of switched resistors, each comprising a switch in series with a resistor. A constituent switched resistor of the plurality of switched resistors is connected to another switched resistor in parallel. When the plurality of switched resistors are switched by a gain-control logic, a plurality of switched current sources and a plurality of grounded resistors are switched correspondingly such that the plurality of switched current sources deliver a transient current, an equivalent of which flows through the plurality of grounded resistors out from the input side of the inverting amplifier, leading to a feedback factor of the PGA being constant.

According to one aspect of one or more embodiments of the present invention, a method for realizing a constant bandwidth transient-free gain control in a PGA includes connecting a feedback resistor across an input side and an output side of the inverting amplifier, connecting an SCR array in parallel to the feedback resistor, the SCR array being configured to tune a gain range between a maximum and a minimum and including a plurality of switched resistors, each comprising a switch in series with a resistor, and switching the plurality of switched resistors by a gain-control logic such that a plurality of switched current sources and a plurality of grounded resistors are switched correspondingly to deliver a transient current, an equivalent of which flows through the plurality of grounded resistors out from the input side of the inverting amplifier, leading to a feedback factor of the PGA being constant. A constituent switch resistor of the plurality of switched resistors is connected to another switched resistor in parallel.

Other aspects and advantages of the invention will be apparent from the following description and the appended claims.

DETAILED DESCRIPTION

Figure 1:
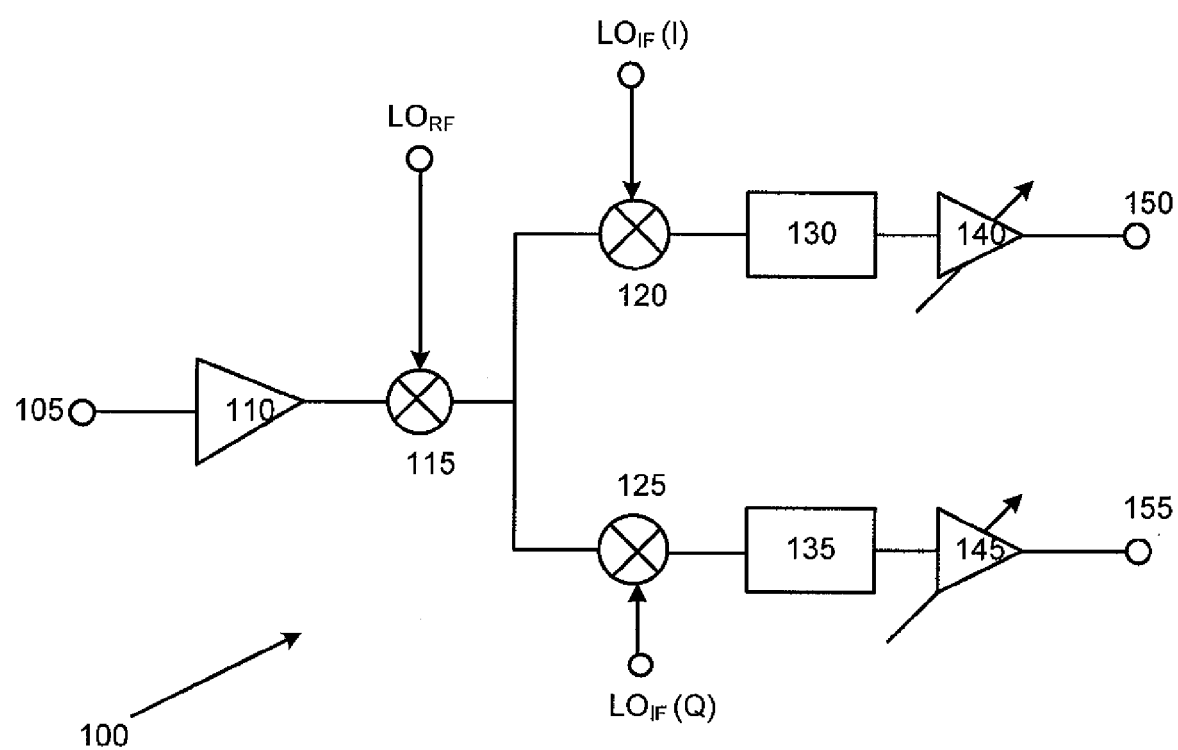
FIG. 1 shows a block diagram of a receiver in accordance with one or more embodiments of the invention.

Although the aforereferenced PGA structure of FIG. 2 may be LV compliant, gain tuning through either $R_{ff}$ 215 or $R_{fb}$ 220 may vary the feedback factor independently of $V_{DD}$, resulting in a gain-dependent output bandwidth. Secondly, as the input impedance of the PGA is mainly governed by $R_{ff}$ 215, varying $R_{ff}$ 215 without adopting a preceding buffer of high impedance may draw a gain-dependent current from the previous stage. The previous stage may be a mixer or a passive filter in a receiver. In order to avoid high impedance buffers and mitigate the effects of loading in a multistage PGA, $R_{fb}$ 220 may be tuned instead. However, tuning of $R_{fb}$ 220 may induce another gain-dependent dc current $I_{fb,dc}$ in the feedback loop due to the unequal common-mode levels of $V_{cm,out}$ and $V_{cm,in}$. This gain-dependent dc current may be expressed as:

$$I_{fb,dc} = \left( \frac{V_{cm,out} - V_{cm,in}}{R_{fb}} \right) \quad (3)$$

These unequal common-model levels and the associated gain-dependent dc current may entail a long settling time to re-stabilize the input-output (I/O) CMFBs and the opamp at a new quiescent operating point.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the present invention describe an SCR PGA that provides for gain-independent output bandwidths, sinks out the unwanted gain-dependent dc current, and dispels the need for buffers. In one or more embodiments, such an SCR PGA may be operational underneath a very low-voltage (LV) $V_{DD}$ of 1V or less. For simplicity sake, a $V_{DD}$ of 1V is assumed in the detailed description below. One of ordinary skill in the art will recognize that other $V_{DD}$ values may be used in accordance with one or more embodiments of the present invention.

Figure 2A:
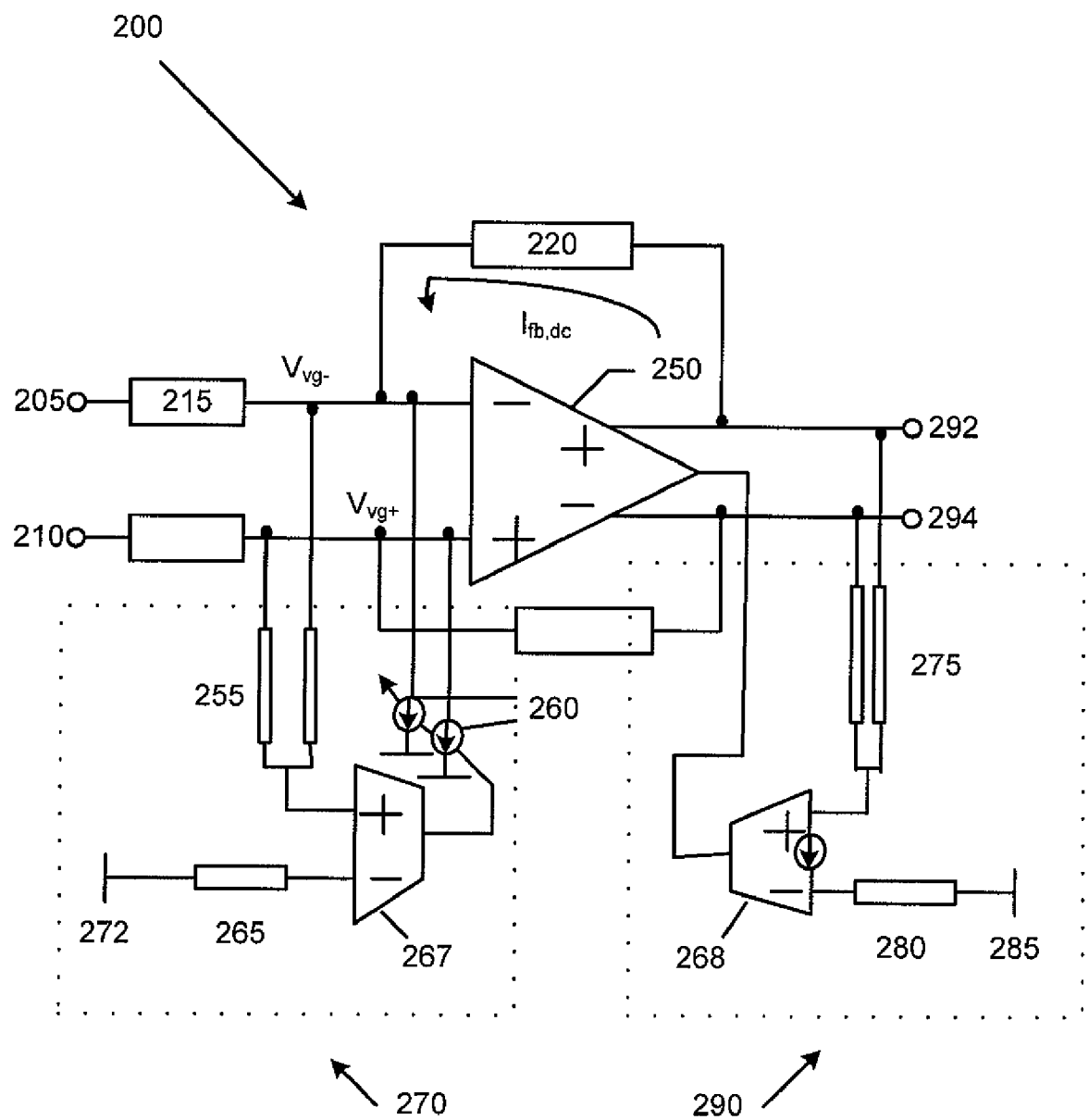
FIG. 2(a) shows a typical low voltage (LV) switched-resistor PGA circuit.
Figure 3:
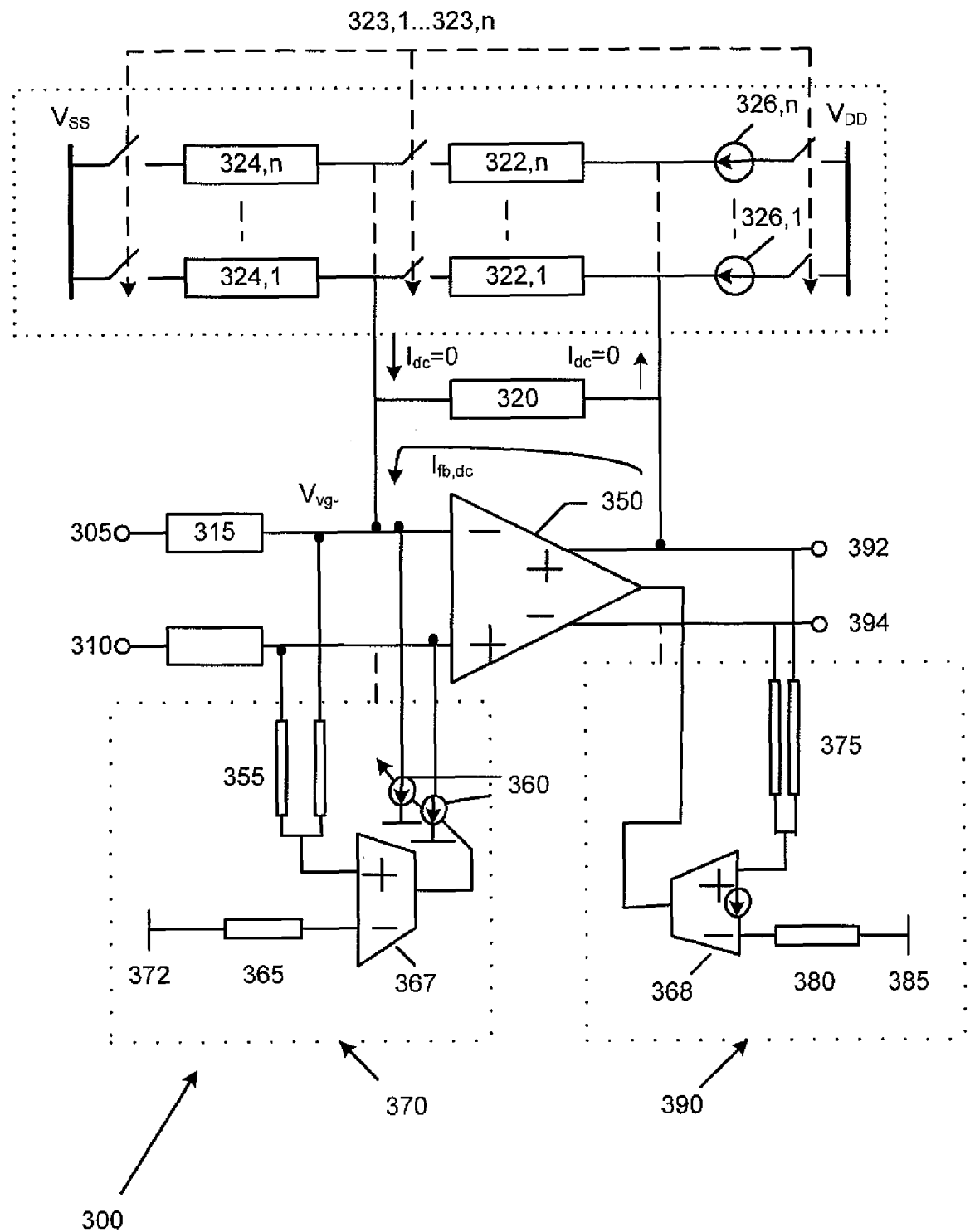
FIG. 3 shows an SCR PGA in accordance with one or more embodiments of the invention.

FIG. 3 shows an SCR PGA 300 in accordance with one or more embodiments of the invention Analogous to FIG. 2(a), amplifier 350 is the inverting amplifier, resistor $R_{ff}$ 315 is the feed forward resistor, and resistor $R^{fb}$ 320 is the feedback resistor. In one or more embodiments, as resistor 315 may also be included in the non-inverting terminal of amplifier 350, the resistor in the non-inverting terminal is intentionally left unlabeled. Terminals 305 and 310 constitute the input ($V_{in}$), CMFB circuits 370 and 390 are the I-CMFB and O-CMFB respectively, and terminals 392 and 394 constitute the output ($V_{out}$). Current sink 360 is the current sink $I_b$, resistors 355 and 375 refer to $R_{cm,in}$ and $R_{cm,out}$ respectively, and resistors 365 and 380 appropriately refer to $R_{cm,in}$ and $R_{cm,out}/2$ respectively. Amplifiers 367 and 368 are constituent elements of I-CMFB 370 and O-CMFB 390 respectively.

In one or more embodiments, a set of switched resistors 322,1 to 322,n (i.e. $R_{fb,1} \ldots R_{fb,n}$) may be added in parallel with $R_{fb}$ 320 to achieve a tunable gain range between a maximum of $$-\frac{R_{fb}}{R_{ff}}$$

and a minimum of $$-\frac{(R_{fb} \| R_{fb,1} \ldots \| R_{fb,n})}{R_{ff}}$$

In one embodiment, when $322,1 \ldots 322,n$ ($R_{fb,1} \ldots R_{fb,n}$) are switched by the gain-control logic $323,1 \ldots 323,n$ ($b_{c,1} \ldots b_{c,n}$) of the switches in the SCR bank, a set of switched current sources $326,1 \ldots 326,n$ ($I_{fb,1} \ldots I_{fb,n}$) and grounded resistors $324,1 \ldots 324,n$ ($R_{x,1} \ldots R_{x,n}$) may be switched correspondingly such that $326,1 \ldots 326,n$ ($I_{fb,1} \ldots I_{fb,n}$) may replace the opamp to deliver the transient current, while $324,1 \ldots 324,n$ ($R_{x,1} \ldots R_{x,n}$) may sink the same current out from $V_{vg-}$ as given by:

$$I_{fb,n} = \left(\frac{V_{cm,out} - V_{cm,in}}{R_{fb,n}}\right) = \frac{V_{cm,in}}{R_{x,n}}, \text{ for } n = 1, 2, 3 \ldots \quad (4)$$

Figure 2B:
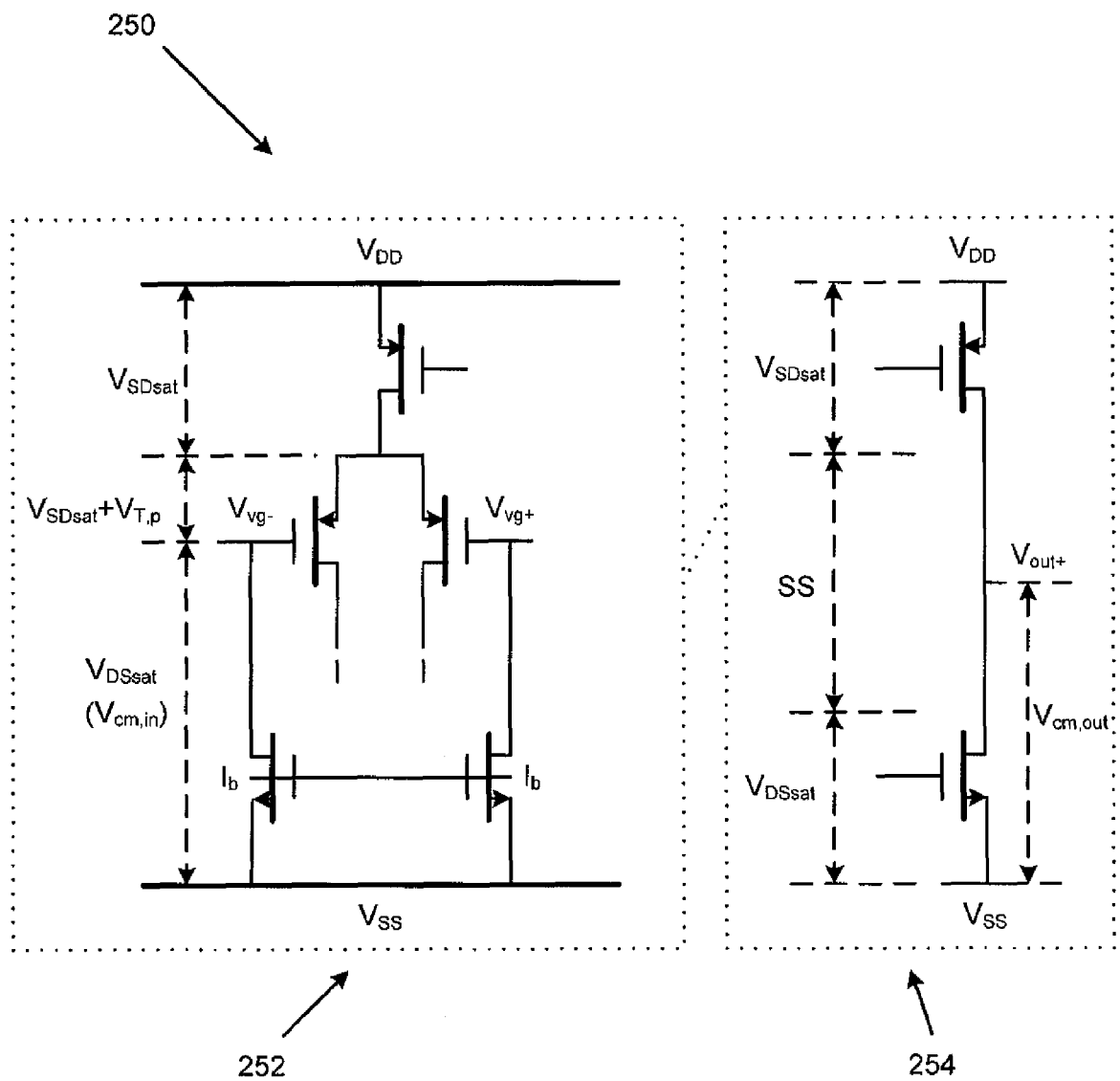
FIG. 2(b) shows the input and output stages of the inverting amplifier of the PGA 200.

In one or more embodiments, equalizing the last two terms of Equation (4) over process, voltage, and temperature (PVT) variation is not complicated because $V_{cm,out}$ and $V_{cm,in}$ (see FIG. 2(b)) are mirrors of $V_{ref,out}$ 385 and $V_{ref,in}$ 372 respectively. In one or more embodiments, $V_{ref,out}$ 385 and $V_{ref,in}$ 372 may be generated underneath one master $V_{DD}$ (for e.g., $V_{ref,out} = V_{DD}/2$, and $V_{ref,in} = V_{DD}/10$), while $R_{fb,n}$ 322,n and $R_{x,n}$ 324,n may be synthesized using the same unit resistor $R_u$ (for e.g., $R_{fb,n} = \alpha_n R_u = 4 R_{x,n}$, for n=1, 2, 3 . . . . Here $\alpha_n$ is a positive integer representing a resistive ratio). Any PVT variation may result in a common-mode disturbance in the last two terms of Equation (4). In one or more embodiments, matching the first term of Equation (4) to the rest may involve an extra signal conversion such that the newly generated switched current sources ($I'_{fb,1} \ldots I'_{fb,n}$) may track the PVT variations of $322,1 \ldots 322,n$ ($R_{fb,1} \ldots R_{fb,n}$), $324,1 \ldots 324,n$ ($R_{x,1} \ldots R_{x,n}$) $V_{ref,out}$ 385, and $V_{ref,in}$ 372. In one or more embodiments, the SCR bank may be driven by two potential levels, $V_{DD}$ and $V_{SS}$.

Figure 4:
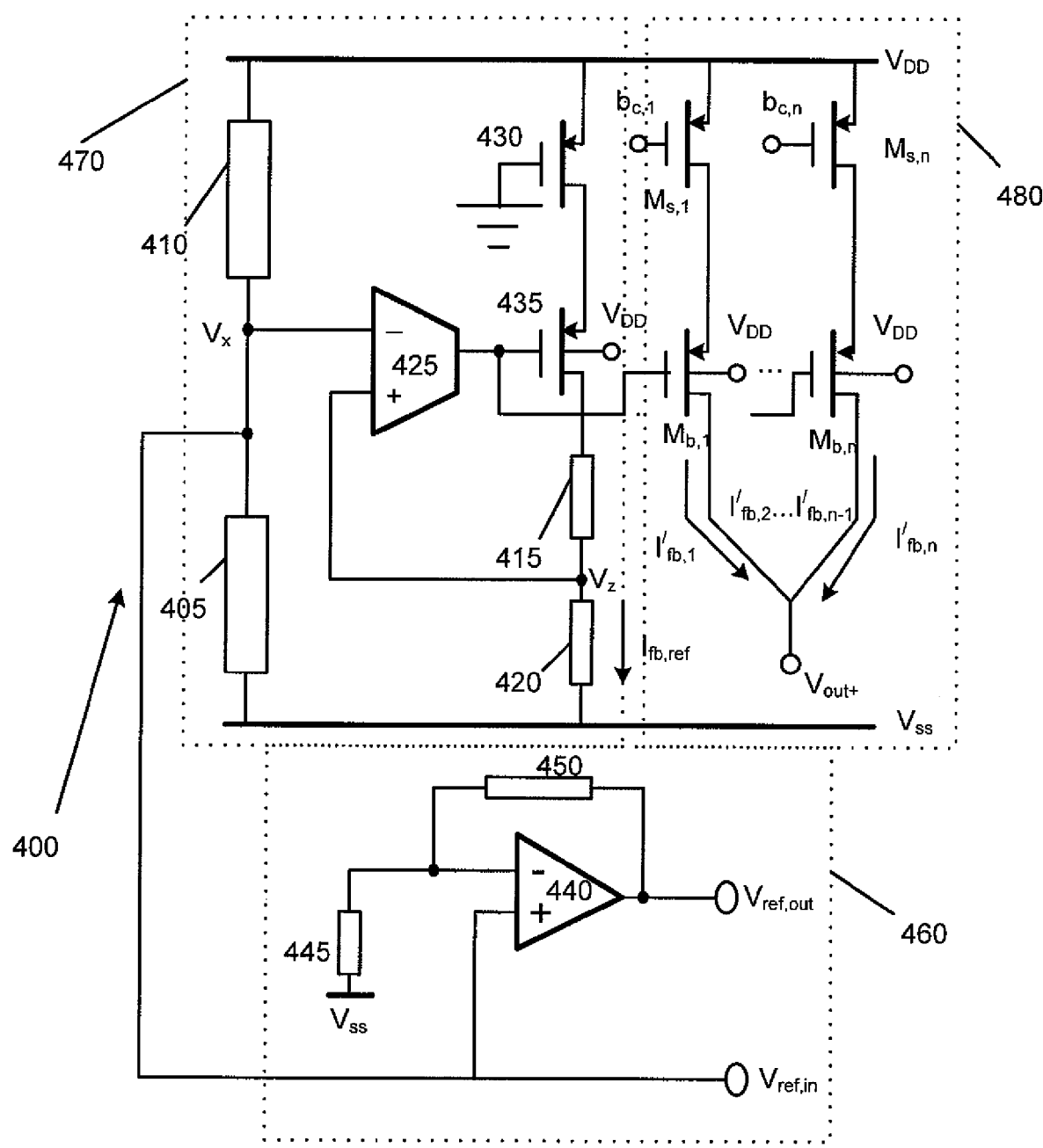
FIG. 4 shows an R-to-I conversion circuit for reference voltage and switched-current-sources generation in accordance with one or more embodiments of the invention.

FIG. 4 shows a LV resistor-current (R-to-I) conversion circuit 400 for generating $V_{ref,out}$, $V_{ref,in}$ and $I'_{fb,1} \ldots I'_{fb,n}$, as discussed above, in accordance with one or more embodiments of the invention. Such a circuit may approach the ideal $I_{fb, 1} \ldots I_{fb, n}$, as governed by Equation (4). In one or more embodiments, the R-to-I conversion circuit 400 may include a reference-voltage generation section 460, an R-to-I conversion section 470, and a switched current source section 480. In one or more embodiments, an error amplifier $A_{error}$ 425 in a feedback loop may track the absolute value of $P_3$ 420 underneath a fixed voltage $V_z$. Therefore, the corresponding reference current $I_{fb,ref}$ is proportional to $$\frac{1}{R_3}.$$

In one embodiment, $V_z$ may be a mirror of $V_x$ that may be set to 0.1 V ($V_{DD}/10$), thereby enabling $A_{error}$ 425 to be realized via a p-channel differential pair. Resistors 405, 410, 415 are resistors $R_1$, $R_2$, $R_4$ respectively, and transistor 430 is a dummy transistor $M_d$. $I_{fb,ref}$ may be mirrored afterward to the switched current sources $I'_{fb,1} \ldots I'_{fb,n}$ through transistors $M_1$ 435 to $M_{b,1}, \ldots M_{b,n}$, which may feature the same ratios of $R_{fb,1}$ to $R_{fb,1} \ldots R_{fb,n}$. $I'_{fb,n}$ may be related to the normalized $R_{fb,1}$ through example Equation (5) as:

$$I'_{fb,n} = \frac{V_z}{R_3}\left(\frac{R_{fb,1}}{R_{fb,n}}\right), \text{ for } n = 1, 2, 3 \ldots \quad (5)$$

Making $I'_{fb,n}$ proportional to just $$\frac{V_z}{R_{fb,n}}$$

may be done by substituting $R_3$ 420 with $$\frac{R_{fb,1}}{4}.$$

This may equalize the numerator of Equation (5) to the second term of Equation (4), (i.e., $4V_z = V_{cm,out} - V_{cm,in}$), resulting in example Equation (6)

$$I'_{fb,n} = \frac{4V_z}{R_{fb,n}}, \text{ for } n = 1, 2, 3 \ldots \quad (6)$$

Substituting Equation (6) back into the first term of Equation (4), and replacing $R_{fb,n}$ and $R_{x,n}$ in accordance with $\alpha_n R_u = R_{fb,n} = 4 R_{x,n}$ may lead to example Equation (7) as:

$$\frac{4V_z}{\alpha_n R_u} = \frac{V_{cm,out} - V_{cm,in}}{\alpha_n R_u} = \frac{V_{cm,in}}{\frac{\alpha_n}{4} R_u}, \text{ for } n = 1, 2, 3 \ldots \quad (7)$$

In one or more embodiments, as $V_z$, $V_{cm,out}$, and $V_{cm,in}$ (see FIG. 2(b) and FIG. 4) are mirrors of $V_x = V_{DD}/10$, $V_{ref,out} = V_{DD}/2$, and $V_{ref,in} = V_{DD}/10$, the error voltage ($V_\delta$) associated with $V_{DD}$, and the error resistance ($R_\delta$) associated with $R_u$ may have no effect on the balancing of Equation (7). This may be expressed as example Equation (8):

$$4\frac{(V_{DD} \pm V_\delta)}{10} = \frac{(V_{DD} \pm V_\delta)}{2} - \frac{(V_{DD} \pm V_\delta)}{10} \quad (8)$$
$$= \frac{\frac{(V_{DD} \pm V_\delta)}{10}}{\frac{\alpha_n}{4}(R_u \pm R_\delta)}$$

In one or more embodiments, as seen from example Equation (8), the R-to-I conversion circuit may yield an overall PVT-insensitive operation, whose employment may further the static and dynamic performances of the SCR PGA.

In one or more embodiments, the current mirror $M_1$ to $M_{b,1} \ldots M_{b,n}$ may raise the precision by adding $$R_4 = \frac{R_3(V_D - V_z)}{V_z},$$

thereby level shifting the drain voltage $V_D$ of $M_1$ to match that of $M_{b,1} \ldots M_{b,n}$.

In one or more embodiments, the overall resistor matching, and the ground-noise rejection of $A_{error}$ 425 and $A_{ref}$ 440 may be enhanced by selecting, for example, $$R_1 = \frac{R_2}{9} = R_3 = \frac{R_4}{4} = R_5 = \frac{R_6}{4},$$

thereby resulting in a resistor spread of just 9. Here, $A_{ref}$ 440 may form a non-inverting amplifier for buffering $V_{ref,out}$. In FIG. 4, resistors 445 and 450 refer to resistors $R_5$, one side of which is driven at $V_{SS}$, and $R_6$ respectively.

In one or more embodiments, $I'_{fb,1} \ldots I'_{fb,n}$ may be switched through transistors $M_{s,1} \ldots M_{s,n}$ rather than $M_{b,1} \ldots M_{b,n}$ such that $M_{s,1} \ldots M_{s,n}$ may attain the maximum overdrive voltage, leading to reduced device sizes and lower charge injection values. In one embodiment, as only the current paths are opened, the gate-to-source capacitance of $M_{b,1} \ldots M_{b,n}$ may be kept charged for a faster turn-on time.

In one or more embodiments, connecting $M_{b,1} \ldots M_{b,n}$ to $V_{DD}$ may prevent charge injection of $M_{s,1} \ldots M_{s,n}$ from coupling to the gates thereof through a body-to-gate parasitic capacitance thereof, thereby theoretically yielding 200% to 300% shorter transients depending on the gain step.

In one or more embodiments, the feedback factor $\beta_{PGA}$ may be expressed as example Equation (9):

$$\beta_{PGA} = \frac{1}{\left(1 + \left(\frac{R_{fb} \| R_{fb,1} \ldots \| R_{fb,n}}{R_{ff} \| R_{x,1} \ldots \| R_{x,n}}\right)\right)} \quad (9)$$

In one or more embodiments, $\beta_{PGA}$ may be stabilized when the two conditions ((10) and (11)) specified below are satisfied concurrently.

$$\frac{R_{fb}}{R_{ff}} = \frac{R_{fb}}{R_{x,n}} \leq \frac{V_{cm,out} - V_{cm,in}}{V_{cm,in}}, \text{ for } n = 1, 2, 3 \ldots \quad (10)$$

and $$\beta_{PGA} \leq \frac{V_{cm,in}}{V_{cm,out}} \quad (11)$$

As conditions (10) and (11) depend on relative ratio rather than absolute values, $\beta_{PGA}$ may be robustly stabilized against gain over PVT. Advantages of a constant $\beta_{PGA}$ may include unvarying settling time and constant stopband rejection.

In one or more embodiments, the constancy of PGA may practically depend on the ratio of resistances of $R_{cm,in}$ to $R_{ff}$ of and $R_{x,1} \ldots R_{x,n}$. Even with a large $R_{cm,in}$ in comparison to $R_{ff} \| R_{x,1} \ldots \| R_{x,n}$, $\beta_{PGA}$ may only vary in very small quantities, leading to only a small bandwidth variation. In one or more embodiments, identical PGAs may be cascaded to attain required gain range. Although identical cascaded PGAs reduce bandwidth, which is multiplied by a factor of $$\sqrt{2^{\frac{1}{N}} - 1}$$

(N being the number of cascaded stages), a large $\beta_{PGA}$ may result in a net bandwidth enlargement, with an obvious increase in power due to increase in the number of PGAs.

It will be obvious to one of ordinary skill in the art that the abovementioned SCR circuit details, transistor types and choices, R-to-I conversion circuit elements, R-to-I conversion choice parameters, input and output sections of the SCR PGA all are explained for clarity purposes and any variations in them would not depart from the scope of the invention. Modifications in the aforementioned are well within the scope of the invention.

In one or more embodiments, dc-offset cancellation may be incorporated for a fully differential circuit implementation, whereby the even-harmonic distortion may be suppressed effectively such that only the odd harmonics are dominant. In one embodiment, an example determination of the third-harmonic distortion (HD3) of a highly linear resistor in series with a nonlinear n-MOS switch would require an assumption of reception of the sinusoidal signal by the terminal in the resistor side, with the terminal in the switch side being grounded. HD3 may then be expressed in the form of example Equation (12) as:

$$HD3 \approx \frac{3}{32}\left(\frac{V_{out-,p}}{V_g - V_{cm,in} - V_{T,n}}\right)^2 \cdot \left(\frac{r_{on}}{R_{fb}}\right)^3, \quad (12)$$

where $V_g$ is the transistor gate voltage, $V_{out-,p}$ is the peak value of the output voltage, and $r_{on}$ is the transistor on-resistance. For example, for a HD3 of a very low level, $r_{on}$ may be a small fraction, albeit sizeable, of $R_{fb}$. This indicates that explicitly biasing $V_{cm,in}$ to a value close to one of the supply rails may help improve the linearity due to an increase in $V_{OD}$.

In one or more embodiments, the squared output thermal noise of the PGA may be lowered by keeping the resistor spread small and increasing the level of $V_{cm,in}$.

As discussed above, one or more embodiments of the SCR PGA offers advantages, not limited to a stable feedback factor, transient-free gain control, and elimination of loading effects in a multi-stage PGA. In one or more embodiments, stable selectivity against gain is ensured as the bandwidth requirement of the PGA may be relaxed. In one such embodiment, the bandwidth requirement of the PGA may be relaxed to less than 20 MHz. In one or more embodiments, reduction of the settling times in gain change may be achieved, and one or more embodiments may offer enhanced stopband rejection.

While the invention has been described with respect to an exemplary embodiment of an SCR PGA for achieving a constant bandwidth transient-free gain control, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A switched-current resistor (SCR) programmable gain array (PGA) for constant-bandwidth gain control, comprising:
   an inverting amplifier;
   a feedback resistor forming a feedback loop between an output side and an input side of the inverting amplifier; and
   a switched current resistor (SCR) array connected in parallel to the feedback resistor, and configured to tune a gain range between a maximum and a minimum, the SCR array comprising:
      a plurality of switched resistors, each comprising a switch in series with a resistor,
      wherein a constituent switched resistor of the plurality of switched resistors is connected to another switched resistor in parallel, and
      wherein when the plurality of switched resistors are switched by a gain-control logic, a plurality of switched current sources and a plurality of grounded resistors are switched correspondingly such that the plurality of switched current sources deliver a transient current, an equivalent of which flows through the plurality of grounded resistors out from the input side of the inverting amplifier, leading to a feedback factor of the PGA being constant.

2. The SCR PGA according to claim 1, wherein the inverting amplifier is an operational amplifier.

3. The SCR PGA according to claim 1, wherein the inverting amplifier comprises a p-MOS differential pair as a first stage and a common-source amplifier as a second stage.

4. The SCR PGA according to claim 3, wherein the SCR PGA further comprises a resistor-to-current (R-to-I) conversion circuit to generate the plurality of switched current sources, the R-to-I conversion circuit comprising:
  a reference-voltage generation section where a reference input voltage and a reference output voltage, mirrored by a common-mode input voltage and a common-mode output voltage respectively, are generated;
  an R-to-I conversion section comprising an error amplifier in a feedback loop to track a reference current flowing through a resistor; and
  a practical switched current source generation section that generates switched current sources based on the reference current mirrored from the R-to-I conversion section.

5. The SCR PGA according to claim 1, wherein the switch associated with the resistor in the plurality of switched resistors is realized with an n-MOS transistor.

6. The SCR PGA according to claim 1, wherein resistors in the plurality of switched resistors are chosen such that a resistor spread is kept at a minimum.

7. The SCR PGA according to claim 1, wherein the SCR PGA further comprises a circuit for dc-offset cancellation.

8. The SCR PGA according to claim 1, wherein constituent resistors of the plurality of switched resistors and the plurality of grounded resistors are synthesized using a same unit resistor.

9. The SCR PGA according to claim 1, wherein the plurality of switched current sources is realized through n-MOS transistors.

10. The SCR PGA according to claim 4, wherein the reference input voltage and the reference output voltage are scaled fractions of a master voltage.

11. The SCR PGA according to claim 4, wherein the error amplifier of the R-to-I conversion section is a p-channel differential pair amplifier.

12. The SCR PGA according to claim 7, wherein a common-mode input voltage of the inverting amplifier is biased close to a supply rail.

13. A receiver for use in wireless local area networks, the receiver comprising:
  a low noise amplifier;
  a first mixer that receives as an input a first reference local oscillator frequency in a Radio Frequency (RF) range;
  a second mixer that receives as an input a second reference local oscillator frequency in an Intermediate Frequency (IF) range;
  a channel selection filter; and
  an SCR PGA, the SCR PGA comprising:
    an inverting amplifier;
    a feedback resistor forming a feedback loop between an output side and an input side of the inverting amplifier; and
    a switched current resistor (SCR) array connected in parallel to the feedback resistor, and configured to tune a gain range between a maximum and a minimum, the SCR array comprising:
      a plurality of switched resistors, each comprising a switch in series with a resistor,
      wherein a constituent switched resistor of the plurality of switched resistors is connected to another switched resistor in parallel, and
      wherein when the plurality of switched resistors are switched by a gain-control logic, a plurality of switched current sources and a plurality of grounded resistors are switched correspondingly such that the plurality of switched current sources deliver a transient current, an equivalent of which flows through the plurality of grounded resistors out from the input side of the inverting amplifier, leading to a feedback factor of the PGA being constant.

14. The receiver according to claim 13, wherein the SCR PGA further comprises circuitry for de-offset cancellation.

15. The receiver according to claim 13, wherein the RF and IF reference local oscillator frequencies are synthesized by a same frequency source.

16. A method for realizing a constant bandwidth transient-free gain control in a PGA, the method comprising:
  connecting a feedback resistor across an input side and an output side of an inverting amplifier;
  connecting a switched current resistor (SCR) array in parallel to the feedback resistor, the SCR array being configured to tune a gain range between a maximum and a minimum and comprising:
    a plurality of switched resistors, each comprising a switch in series with a resistor,
    wherein a constituent switched resistor of the plurality of switched resistors is connected to another switched resistor in parallel; and
  switching the plurality of switched resistors by a gain-control logic such that a plurality of switched current sources and a plurality of grounded resistors are switched correspondingly to deliver a transient current, an equivalent of which flows through the plurality of grounded resistors out from the input side of the inverting amplifier, leading to a feedback factor of the PGA being constant.

* * * * *